(12) United States Patent
Schieber (10) Patent No.: US 11,929,729 B2
(45) Date of Patent: Mar. 12, 2024

(54) WAFER LEVEL PACKAGE AND METHOD OF MANUFACTURE

(71) Applicant: RF360 SINGAPORE PTE. LTD., Singapore (SG)

(72) Inventor: Markus Schieber, Munich (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 451 days.

(21) Appl. No.: 15/734,202

(22) PCT Filed: Apr. 16, 2019

(86) PCT No.: PCT/EP2019/059777
§ 371 (c)(1),
(2) Date: Dec. 1, 2020

(87) PCT Pub. No.: WO2019/233667
PCT Pub. Date: Dec. 12, 2019

(65) Prior Publication Data
US 2021/0226605 A1      Jul. 22, 2021

(30) Foreign Application Priority Data
Jun. 4, 2018   (DE) .......................... 102018113218.2

(51) Int. Cl.
*H03H 9/10* (2006.01)
*H03H 3/02* (2006.01)
(Continued)

(52) U.S. Cl.
CPC ............ *H03H 9/1071* (2013.01); *H03H 3/02* (2013.01); *H03H 3/08* (2013.01);
(Continued)

(58) Field of Classification Search
CPC ............ H03H 9/1071; H03H 9/02086; H03H 9/1014; H10N 30/883; H10N 30/875
See application file for complete search history.

(56) References Cited

U.S. PATENT DOCUMENTS 9,647,196 B2   5/2017   Bauer et al.
2004/0259325 A1   12/2004   Gan
(Continued)

FOREIGN PATENT DOCUMENTS

CN       1607682 A      4/2005
WO       2012136544      10/2012
WO       2017164816      9/2017

OTHER PUBLICATIONS

International Search Report and Written Opinion dated Jul. 15, 2019, corresponding to Application No. PCT/EP2019/059777.

*Primary Examiner* — Bryan P Gordon
(74) *Attorney, Agent, or Firm* — Patterson + Sheridan LLP (57) ABSTRACT

A wafer level package comprises a functional wafer with a first surface, device structures connected to device pads arranged on the first surface. A cap wafer, having an inner and an outer surface, is bonded with the inner surface to the first surface of the functional wafer. A frame structure surrounding the device structures is arranged between functional wafer and cap wafer. Connection posts are connecting the device pads on the first surface to inner cap pads on the inner surface. Electrically conducting vias are guided through the cap wafer connecting inner cap pads on the inner surface and package pads on the outer surface of the cap wafer.

6 Claims, 4 Drawing Sheets

(51) Int. Cl.
  *H03H 3/08* (2006.01)
  *H03H 9/02* (2006.01)
  *H10N 30/02* (2023.01)
  *H10N 30/06* (2023.01)
  *H10N 30/87* (2023.01)
  *H10N 30/88* (2023.01)
(52) U.S. Cl.
  CPC .... *H03H 9/02086* (2013.01); *H03H 9/02913* (2013.01); *H03H 9/1014* (2013.01); *H10N 30/02* (2023.02); *H10N 30/06* (2023.02); *H10N 30/875* (2023.02); *H10N 30/883* (2023.02)

(56) References Cited

U.S. PATENT DOCUMENTS

| | | |
|---|---|---|
| 2004/0259625 A1 | 12/2004 | Randall |
| 2007/0015341 A1 | 1/2007 | Ouellet et al. |
| 2016/0118324 A1* | 4/2016 | Guo ................ H03H 9/1014 257/737 |
| 2016/0297674 A1* | 10/2016 | Man .................. B81B 7/007 |
| 2017/0309679 A1* | 10/2017 | Kawasaki ............ H03H 9/0542 |
| 2019/0036510 A1* | 1/2019 | Kikuchi .............. H03H 9/0547 |
| 2019/0267361 A1* | 8/2019 | Rahim ............... H03H 9/14538 |

\* cited by examiner

WAFER LEVEL PACKAGE AND METHOD OF MANUFACTURE

CROSS-REFERENCE TO RELATED APPLICATIONS

This application is a national stage application under 35 U.S.C. 371 of PCT/EP2019/059777, filed Apr. 16, 2019, which claims the benefit of German Application No. 102018113218.2, filed Jun. 4, 2018, both of which are incorporated herein by reference in their entireties.

The invention provides a wafer level package and a method of manufacture that is useful for micro-acoustic devices as providing a cavity for mechanically sensitive device structures thereof.

Wafer level packaging is a preferred method for mass production of electric devices produced on a functional wafer. According to a new approach a thin film package cover is produced that by deposition of package layers above functional device structures. A cavity above the functional device structures can be maintained by protecting the structures under a structured layer of a sacrificial material before applying the cover layers and by later removal of the sacrificial material through release openings made through the packaging layers.

According to another approach a cap wafer is bonded to the functional wafer e.g. by a wafer bonding process. If suitable spacer elements are used a gap can be maintained between functional wafer and cap wafer as a precondition for the cavity package. The cavity can be closed and sealed directly by the wafer bonding step or in a later sealing process.

A main problem of known wafer level package techniques is wafer breakage as mechanical forces can sum up over the total wafer diameter due to different thermal expansions of the used materials. At least a bending of the wafer compound has to be expected that can deteriorate the further processing due to the uneven wafer surface. Moreover scrap wafers and scrap wafer packages may be produced. These forces can already build up at the wafer bonding step or any later thermal step. This problems further increase if one of the wafers is anisotropic and possesses different expansion behavior along different crystal axis thereof. Such problems arises when using crystal cut wafers of piezoelectric material that are required for forming micro acoustic devices like resonators and filters.

It is an object to provide a wafer level package with reduced risk of damage and scrap that can be easily manufactured.

This object is met by a wafer level package and a method of manufacture according to the independent claims.

Embodiments and advantageous features can be taken from dependent claims.

A wafer level package is proposed comprising a functional wafer with functional device structures, a cap wafer and a frame structure arranged between the two wafers to surround and enclose the device structures in a cavity.

The functional device structures are arranged on a first surface of the functional wafer and connected to device pads. The cap wafer has an inner and an outer surface and is bonded with the inner surface to the first surface of the functional wafer. The frame structure seals to the first surface and to the inner surface as well. Connection posts are connecting the device pads on the first surface to inner cap pads on the inner surface of the cap wafer. Electrically conducting vias are guided through the cap wafer and connect the inner cap pads with package pads arranged on the outer surface of the cap wafer and hence outside the package. Hence, a completely sealed and closed cavity for the functional device structures is achieved and external contact to the package is provided by the package pads on an outer surface. The vias are filled with a conducting material and do not affect the tightness of the package. Cap wafer and functional wafer form a mechanically stable compound.

According to a preferred embodiment the functional wafer is a substrate wafer with a thin film functional layer on its first surface. The cap wafer is made from the same material like the substrate wafer. And the thickness of the cap wafer is smaller than the thickness of the functional wafer. By this arrangement the thermal expansions of both wafer are the same and no thermal stress can arise and hence no damage or distortion that is due to the thermal stress has to be feared.

Further, the same material allows to reduce the thickness of the cap wafer relative to that of the functional wafer without reducing the mechanical stability that on the other hand, in connection with thermal stress, would enhance the risk of scrap.

The thin film functional layer may be a piezoelectric layer deposited or grown or bonded on a substrate wafer. The device structures may then be electrodes adapted for stimulating acoustic waves in the piezoelectric layer. Such devices may be embodied in SAW or BAW technology that both can use the proposed wafer level packaging concept. The SAW or BAW devices can form resonators and filters that can be used for operating RF signals in wireless communication devices.

A preferred substrate wafer is a silicon wafer allowing to process according to approved semiconductor methods. High process reliability and only small tolerances during manufacture can be achieved.

Functional wafer and cap wafer can be provided and manufactured independently. At least on its inner surface the cap wafer can comprise a structured metallization including inner cap pads and conductor lines coupled thereto that form a wiring. Accordingly, an additional wiring may be formed on the outer surface.

According to an embodiment a conductor line on the inner surface may be a bridging line connecting two connection posts. Between the two connection posts on the first surface of the functional wafer a conductor line is guided in a direction crossing the bridging line. As the conductor line is electrically isolated against the connection posts and keeps an isolating air gap to the bridging line, a line crossing without shorting is achieved. Thereby an area consuming wiring with line crossings on the surface of the functional wafer is avoided. Hence, area is saved and the device can be made with smaller surface area.

The vias through the cap wafer are preferably completely filled with a metal. The metal is selected such that hole-filling can be made easily. A preferred metal for filling holes up to a high aspect ratio is tungsten. But any other metal that enables an isotropic and hence conformal deposition at steep or vertical holes and trenches is useful too.

In an advantageous variant the hole-filling metal in the via may also be used to form a structured metallization on a surface of the cap wafer. This needs a deposition of the metal to the entire surface and subsequent structuring. Enforcing the layer thickness of the metal may be done by plating in a subsequent step.

In the package the frame structure and the connecting posts can be manufactured by using the same process steps thereby achieving the same layer structure.

Besides the connecting posts used for electrically contacting device pads on the first surface to inner cap pads, to a bridging line or any other wiring on the inner surface of the cap wafer other connection posts may be present in the wafer level package that are not coupled to any electrical potential or current-carrying element.

For manufacturing the proposed wafer level package two slightly different process sequences are proposed but with both sequences nearly the same product can be achieved.

Both manufacturing variants comprises the same sequence of steps a) to h):
a) providing a cap wafer
b) forming a hole in the cap wafer to a depth dv
c) filling up the hole with a metal to form a prestage of a via
d) structuring of metal on surface if requested, else remove metal from wafer surface
e) providing a structured metallization layer in contact with the hole filling metal to form first contact pads
f) bonding the cap wafer with the contact pads to a second wafer
g) grinding, if necessary polishing, the cap wafer from the surface opposite to the contact pads and exposing the metal filled holes from the back thereby forming a through going via
h) forming second contact pads on the cap wafer in contact with the exposed vias.

According to the first manufacturing variant step e) comprises applying a first bond metal onto the first contact pads. Further, the second wafer used in step f) is a functional device wafer comprising a carrier wafer provided with a thin functional layer thereon, on which device structures and device pads covered with a second bond metal are arranged. The bonding in step f) is done by bonding the first contact pads covered with a first bond metal to the device pads covered with a second bond metal on the functional wafer by a suitable bonding process.

According to the second manufacturing variant steps a) to g) are performed with the following deviating and additional stipulations:

In step f) a temporary carrier wafer is used as the second wafer, and after step h) steps i) to l) are performed:
i) providing a first bond metal to the second contact pads on the cap wafer
j) providing a device wafer comprising a carrier wafer with a thin functional layer thereon, on which device structures and device pads are arranged that are covered with a second bond metal,
k) performing a wafer-bond process by bonding the second contact pads to the device pads
l) cleavage of the temporary carrier wafer from the cap wafer thereby exposing the first contact pads that form the package pads of the package for external electrical termination.

First and second variant are different only in view of handling the cap wafer and in view of the step sequence before the bonding of the cap wafer to the functional device wafer. In the second variant the cap wafer is turned one time and hence the surface used for bonding to the functional wafer is opposite to the surface that is used for bonding the cap wafer to the functional wafer in the first variant.

An advantage of the second variant may be that the grinding of the surface of the cap wafer is performed independent from the functional wafer. Hence, any potential scrap produced in handling the cap wafer is restricted to the cap wafer and hence, potential financial losses are kept small.

In both variants the electric passivation of the cap wafer is advantageous. In a step b1) performed after step b) a first passivation layer at least on the surface of the cap wafer with the hole is produced. A second passivation layer is produced a step g1) performed after step g) at least on the surface of the cap wafer after exposing the via from the back.

The passivation layer can be produced by thermal oxidation of the cap wafer material that usually silicon. But it is possible to deposit a thin isolating layer of dielectric to the respective entire surface.

Step c) can comprise depositing a layer of tungsten to the entire surface of the cap wafer as a hole filling material and step d) can comprise structuring of the tungsten layer to form the first contact pads.

A metal layer can be deposited onto the first contact pads by electro-less plating or by electroplating. This layer may comprise Ni, Sn, Cu and/or Au in any sequence or composition.

According to an embodiment step b) comprises performing a lithography for defining the holes and dicing streets as well. These dicing streets are arranged between each first and second section of the cap wafer that are neighbored on the wafer but assigned to different devices to be singulated in a final step. The holes and the dicing streets are produced e.g. by plasma etching using a resist mask produced lithographically. Then grinding in step g) comprises exposing the dicing streets together with the metal filled holes.

According to a further advancement, step b) comprises defining and etching a ring-shaped trench concentric to and in a distance to the hole. In step c) the ring-shaped trench and the hole are filled in the same step with the hole-filling metal. Thereby a shield structure for the preformed via is formed protecting the via from electromagnetic coupling that may disturb the signal quality in the later devices that are RF devices.

In the following the wafer level package and its manufacture will be explained in more detail with reference to the accompanied drawings.

The drawings are schematically only and not drawn to scale. Some elements may be depicted enlarged for better visibility. Others may depicted with reduced size.

A first embodiment for manufacturing the wafer level package is explained with reference to FIGS. 1 to 5 showing different stages during the manufacturing process of this embodiment. A cap wafer CW consists of a material like Si that is suitable for current wafer processing technology. On a surface of this cap wafer assigned to the later inner surface holes HL and trenches TR are etched in the same step. The holes are corresponding to later vias. The trenches are corresponding to the later dicing streets along which the later packages are singulated. Hence, the trenches are structuring the inner surface according to a grid defining and separating the single chip areas there between.

Figure 1:
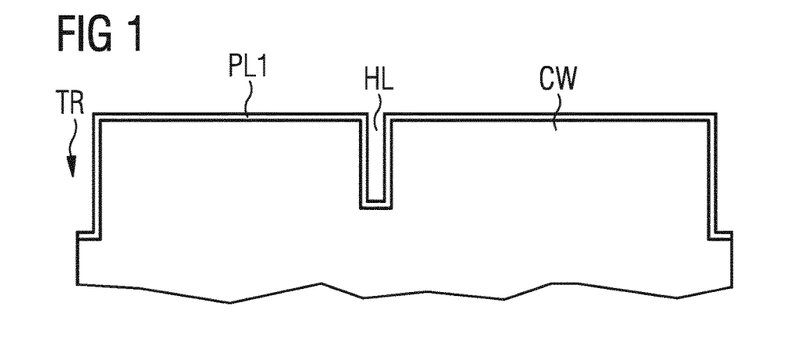
FIGS. 1 to 6 show different stages of a method of manufacturing the wafer level package according to the first embodiment.

Holes and trenches are produced with a proper dry etching technique like a plasma etch thereby using a lithographic resist mask. Etching is performed until the depth of the holes HL exceeds the depth of the planned vias without extending through the whole cap wafer CW. A useful depth is between 20 and 100 µm. Similarly, the trenches must not go through the whole thickness of the cap wafer CW that the cap wafer maintains sufficient stability to be further processed on a wafer level. When using the same opening width for etching holes HL and trenches TR the same depth is achieved. With a higher width of the opening the etching process is faster and results in deeper holes.

In a next step the surface is passivated preferably by a step of thermal oxidation to produce a thin isolating oxide layer on the free surfaces of the wafer. FIG. 1 shows the so produced cap wafer at this stage.

In the next step a hole filling metal is deposited onto the inner surface of the cap wafer CW to fill the hole HL. Tungsten is preferred metal as it can be deposited in an isotropic and conformal manner in holes with high aspect ratios. But any other method for filling the holes is also useful. The hole filling metal can be chosen in dependence of the diameter of the hole opening. A smaller hole diameter requires higher hole filling properties and hence restricts the choice of suitable metals.

The hole filling metal is deposited to the entire surface and can thus be used for forming a structured metallization.

Optionally a further lithographic process including structuring the deposited metal can follow to form further wirings or passive elements like a planar coil or a redistribution for example. Finally the resist for the lithography has to be stripped.

If necessary a step of chemical mechanical polishing CMP can be provided in advance to provide a plane surface on the structured metallization with low roughness.

Otherwise the metallization can be etched back to the hole surface.

In a further metal layer a frame structure FR surrounding the area that is assigned to be enclosed by the later package cavity is formed as part of a second structured metallization.

Figure 2:
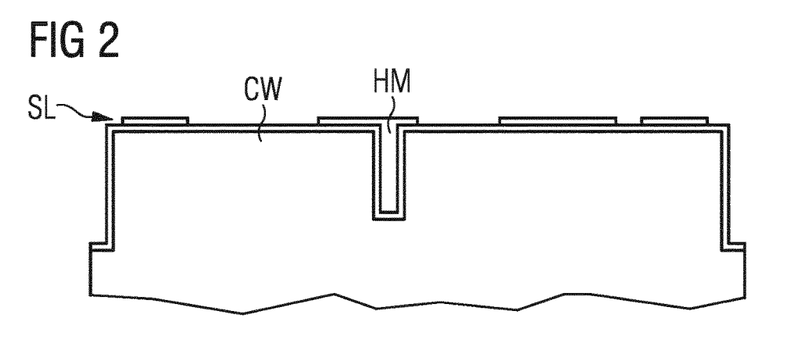

FIG. 2 shows the cap wafer CW with filled holes HL and a structured layer SL of the hole filling metal and/or of the further metal layer on the inner surface. The trenches are kept or etched free from the metal.

Figure 3:
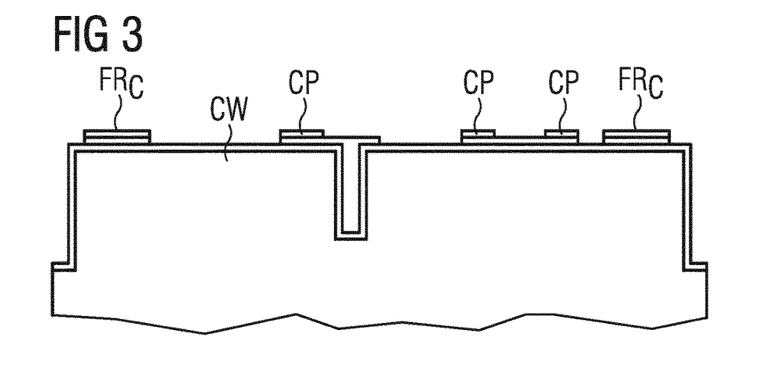

In the next step a metallization for forming contact pads is deposited onto those locations of the existing metallization where contact to the later functional wafer is desired or necessary. For doing this a resist mask is formed in a lithographic step. The metal for the contact pads can be deposited according to the desired later bonding step. In case the existing metal structure comprises W preferably a Sn layer is deposited by evaporation followed by a lift-off process of the resist mask including part of the Sn that has been deposited on the resist mask. But any other metal and deposition technique can be used alternatively. FIG. 3 shows the cap wafer at this step with the so produced cap pads (contact pads) CP and the surrounding frame structure FR.

Figure 4:
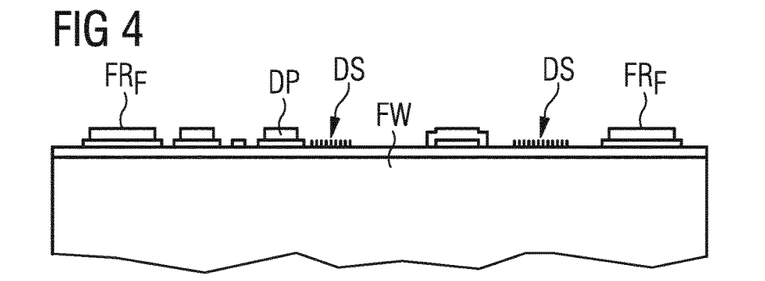

FIG. 4 shows a respective cross section of a functional wafer FW that is provided in parallel. The functional wafer FW preferably comprises the same bulk material like the cap wafer where a Si wafer is preferred. On top of the first surface of the functional wafer FW is a layer of a functional material like a thin piezoelectric layer PL having a thickness of about 500 nm to 10 µm.

At least on top of the piezoelectric device structures DS are formed comprising electrode structures and/or transducers of the electric device that is a SAW device or a BAW device. In the latter case the electrode comprises a bottom electrode and a top electrode sandwiching the piezoelectric layer PL. For a BAW device of the SMR type (solidly mounted resonator) a Bragg mirror is arranged below the sandwich.

The device structures DS further comprise device pads DP for electric contact of the electric device on the functional wafer to the cap wafer CW. Part of the device pads that are not required for electric contact to the external can be used for contact to a wiring structure/cap redistribution layer on the inner surface of the cap wafer CW. Using this wiring structure a contact-free line crossing of conductor lines can be achieved. This means that a line on the first surface of the functional wafer FW can be guided by means of device pad DP to a higher level that is on the inner surface to cross another line on the lower level that is on the first surface. By means of a second device pad return to the lower level is achieved after having crossed the second line.

Besides the device pads DP for electric coupling mere mechanical pads and a frame structure $FR_F$ are formed on the first surface and are made preferably from the same metallization like the device pads. Frame and optionally present mechanically supporting pads or posts (not shown in the figure) are adapted to be bonded to according metal structures on the inner surface of the cap wafer.

To make the metal structures on the functional wafer ready for the wafer bonding process a second bonding metal is applied to these structures in a lithographic step. The second bond metal may comprise Au that can be applied by evaporation onto the masked first surface. But any other metal that is able to for the bonding step to the first bonding metal on the inner surface of the cap wafer can be used too. Finally the evaporation mask can be stripped in a lift-off process.

The design of the second layer may overlap the first layer or not in dependence of achieving a hermetic package.

Figure 5:
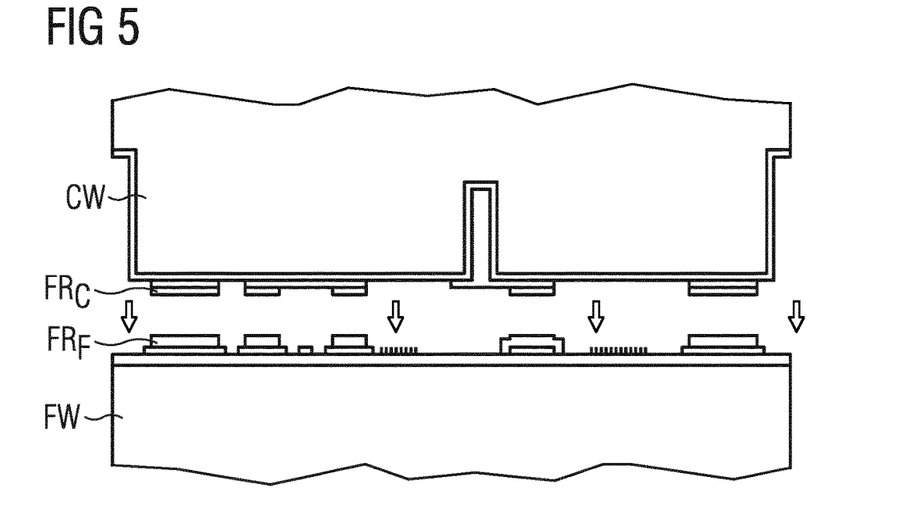

FIG. 5 shows the cap wafer CW and the functional wafer FW in a mutual arrangement where first surface and inner surface are facing each other such that metalizations like device pads DP, inner cap pads CP frame structures FR and optional mechanically supporting posts are opposite each other.

In a wafer bonding process mutually assigned structures are bonded to each other in the same step. After bonding the two wafers together the so-formed package arrangement has enough mechanical stability that the thickness of the cap wafer CW can be reduced. The resulting thickness is lower than the depth of holes and trench such that metal filled holes HL and trenches are exposed and opened at the outwardly facing surface of the cap wafer. Grinding of the cap wafer from the top surface is a preferred method for achieving a reduced thickness. By opening of the trench TR the cap wafer CW is singulated into a multitude of individual cap wafer sections each being assigned to a separate package for a separate device.

Figure 6:
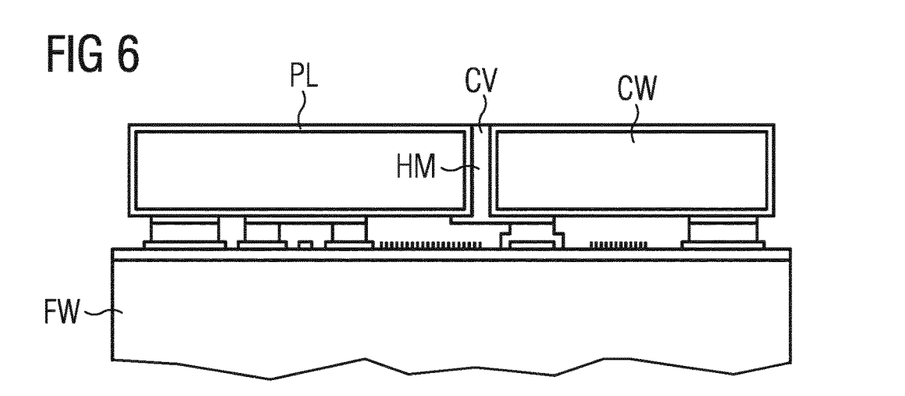

In a next step the exposed Si surface has to be passivated again, e.g. by plasma deposition or sputtering of an insulating material like $SiO_2$. FIG. 6 shows a cross section of the resulting structure. The both wafers are connected by the frame structure, terminal posts TP for electrical connection and redistribution posts RP for making contact to the mentioned line crossing LC. The terminal posts TP, only one of a multitude of terminal posts is shown, are connecting device pads to the metal-filled via CV directly or by means of pad or conductor line on the inner surface. The bonded frame structures on inner and first surface are forming a frame surrounding and enclosing the device structures that a closed cavity is formed between frame, cap wafer and functional wafer. The frame needs no electric connection to an electric terminal but can optionally be grounded.

Further proceeding with the package can be done according to standard processes to achieve the ready manufactured package device. Such steps comprise one or more steps of
- forming external package pads on the outer surface of the cap wafer section
- singulating the packages by dicing through the functional wafer
- applying a redistribution layer as a multilayer structure
- forming a fan-out structure to enhance the distance between external package pads
- applying further isolating or passivating layers
- applying a molding to improve mechanical stability etc.

Figure 7:
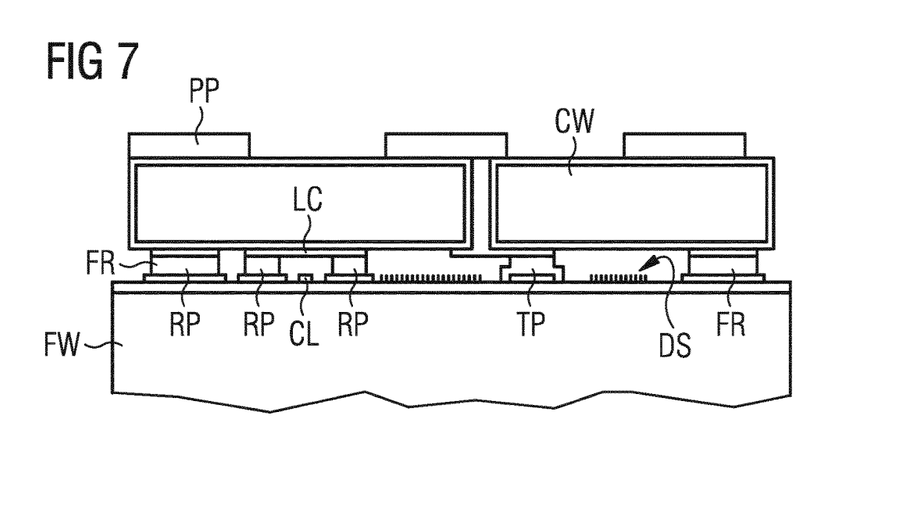
FIG. 7 shows a wafer level package according to the first embodiment.

External package pads on the outer surface of the cap wafer section can be formed by different processes. A first of them comprises
- forming a seed layer e.g. by sputtering a seed metal
- forming a lithographic resist mask
- enforcing the seed layer by electroplating forming e.g. a layer of CuNiAu or Cu alone
- stripping the resist mask
- removing the seed layer in the areas exposed after the resist stripping by etching A second process comprises
- forming a seed layer e.g. by sputtering a seed metal e.g. Ti/Al
- forming a lithographic etch mask
- etching the seed layer in the area not covered by the etch mask
- stripping the etch mask
- enforcing the exposed seed layer areas e.g. by E-less plating e.g. of Ni/Au A third process comprises
- forming a lithographic mask
- evaporating a seed metal like Ti/Al for example
- stripping the mask in a lift-off process
- enforcing the exposed seed layer areas e.g. by E-less plating e.g. of Ni/Au FIG. 7 shows a singulated package device after forming external package pads PP which can function as a UBM for bonding or soldering the package device to a PCB or another circuit environment.

After the process of singulating the individual package devices the fan-out structure can be produced as a multilayer structure. This and other optional processes that are performed after singulation can nevertheless be performed on a wafer-level when fixing the singulated devices in a matrix of e.g. a temporary carrier material like an adhesive foil for example.

A second embodiment for manufacturing the wafer level package is explained with reference to FIGS. 7 to 13 showing different stages during the manufacturing process of this embodiment.

Figure 8:
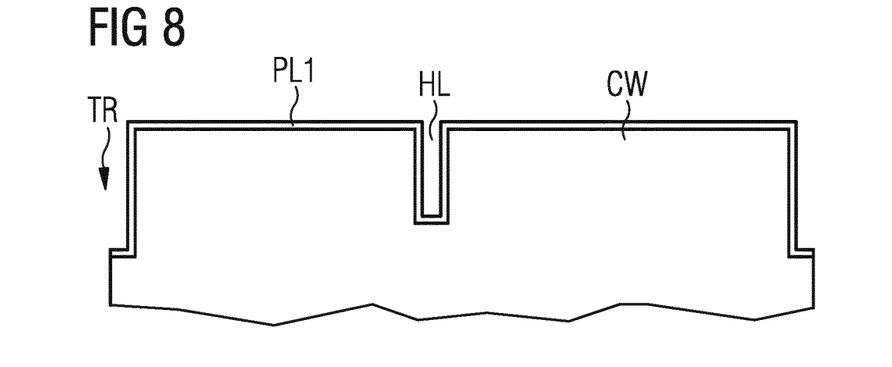
FIGS. 8 to 12 show different stages of a method of manufacturing the wafer level package according to the second embodiment.

FIG. 8 corresponds to FIG. 1 and shows the same or a similar cap wafer provide with holes HL for the later vias, trenches TR and a final passivation layer PL1 formed e.g. by thermal oxidation of the surface of the silicon wafer CW.

Figure 9:
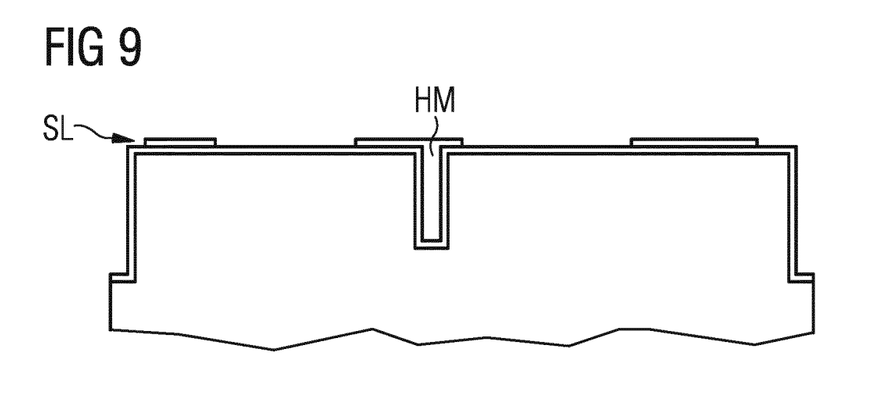

In the next step a hole filling metal like tungsten W is deposited on the entire surface $S_O$ until the hole HL is completely filled. An etch mask is lithographical formed above the W layer and the exposed areas of the W layer are etched. FIG. 9 shows the arrangement after stripping the etch mask.

The remaining and now exposed W layer areas are reinforced by plating, e.g. by E-less deposition of NiAu.

According to this second embodiment the produced metal pads will later function as external package pads PP.

Figure 10:
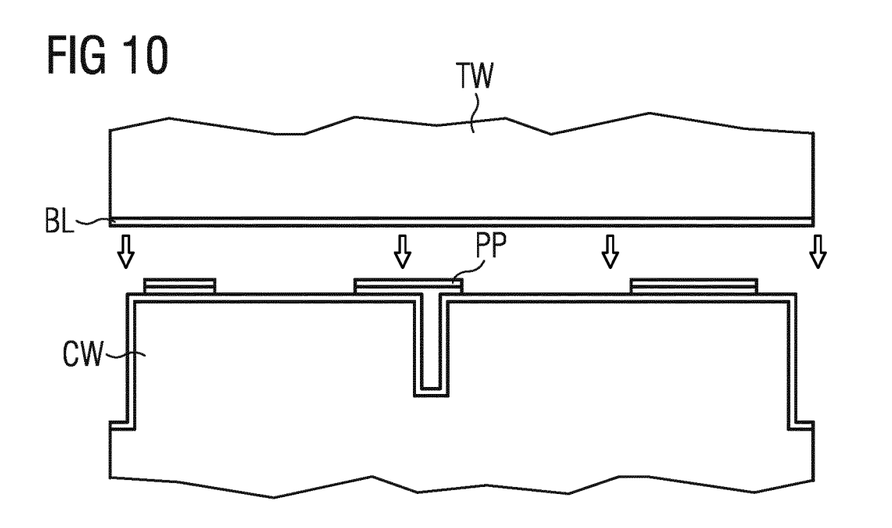

The cap wafer is now bonded to a temporary carrier wafer TW. This may be any carrier with an "adhesive" or another bonding layer BL on top. In an embodiment the bonding layer BL may be a thermos-release layer. FIG. 10 shows the arrangement just before bonding the cap wafer CW with the package pads PP to the bonding layer BL of the temporary carrier wafer TW.

Figure 11:
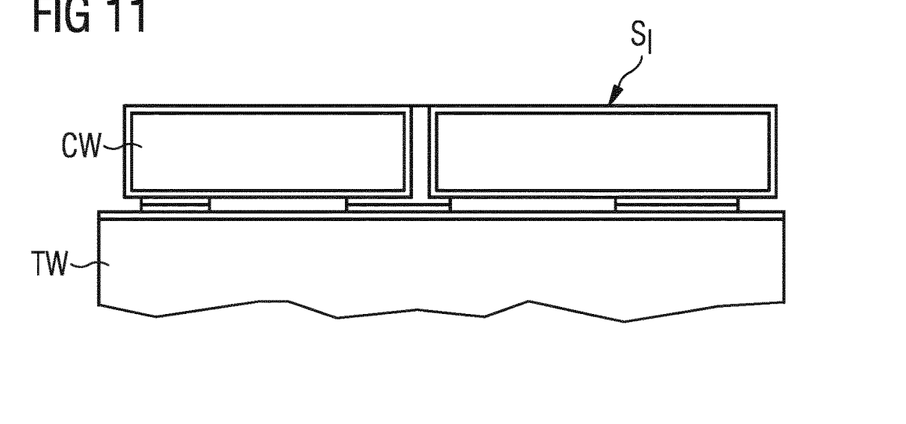

After bonding the cap wafer CW to the temporary carrier wafer TW the so-formed arrangement has enough mechanical stability that the thickness of the cap wafer CW can be reduced. The resulting thickness is lower than the depth of holes and trench such that metal filled holes HL and trenches are exposed and opened at the outwardly facing surface of the cap wafer. Grinding of the cap wafer from the top surface is a preferred method for achieving a reduced thickness. By opening of the trench TR the cap wafer CW is singulated into a multitude of individual cap wafer sections each being assigned to a separate package for a separate device. A passivation layer PL1 is formed e.g. by plasma deposition or sputtering of an insulating material like SiO2 on the silicon cap wafer CW. FIG. 11 shows the arrangement at this step.

In the next step the later inner surface of the cap wafer that is the surface facing away from temporary carrier wafer TW is provided with inner cap pads CP. According to an embodiment but not restricted to this can be done by forming a lithographic mask and depositing a metal layer on the inner surface $S_I$. e.g. by evaporation of Sn.

Figure 12:
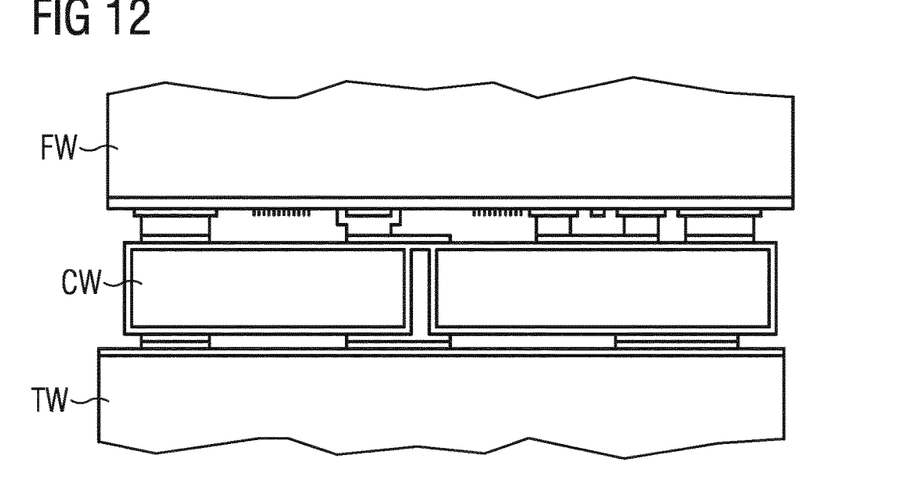

In the next step the so-formed arrangement is permanently bonded with the inner cap pads to the according metal structures of a functional wafer FW like that exemplarily shown in FIG. 4. FIG. 12 shows the arrangement at this step.

Figure 13:
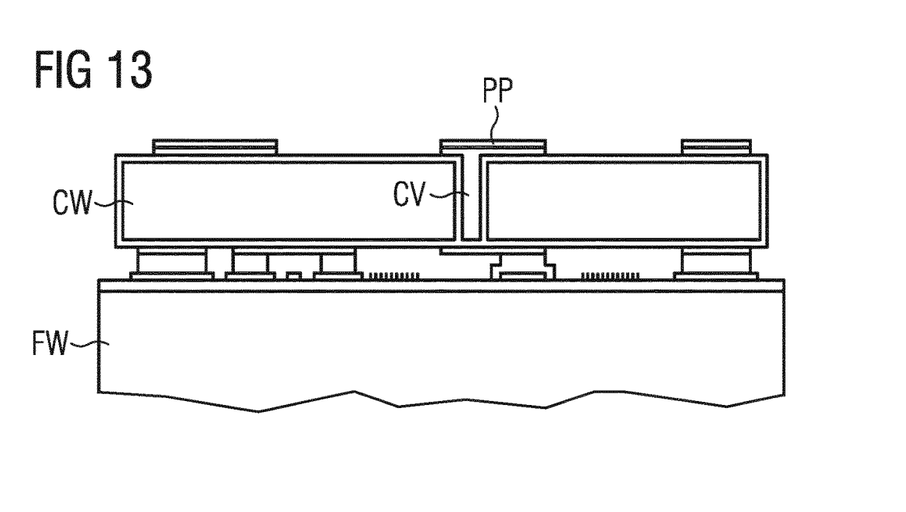
FIG. 13 shows a wafer level package according to the second embodiment.

In a final step the temporary carrier wafer is released e.g. by softening the bonding layer BL in a thermal step or by decomposing or transforming the thermal release layer. FIG. 13 shows the arrangement at this step.

Singulation of individual package devices e.g. by dicing can follow. Further optional packaging steps can complete the package which are the same as already explained with reference to the first embodiment.

LIST OF USED TERMS AND REFERENCE SYMBOLS

CW cap wafer (second wafer)
FW functional wafer (first wafer)
TW temporary carrier wafer
DS device structures
PL thin film piezoelectric layer
DP device pads
$S_I$ inner surface of cap wafer
CP inner cap pads
CV via (through cap wafer) wafer level package
PP package pads, comprising
UBM under bump metallization cap redistribution layer
LC line crossing connection posts, comprising
TP terminal post
RP redistribution post
BM2 second bond metal (on device pads)
BM1 first bond metal (on inner cap pads)
PL1 passivation layer
HL hole
HM hole filling metal
FR frame structure
TR trench (=dicing street)
SL structured layer of hole filling metal on inner surface CL conductor line on inner surface $S_I$
$S_O$ outer surface of CW
BL bonding layer

The invention claimed is:
1. A wafer level package, comprising:
a functional wafer with a first surface;
device structures connected to device pads arranged on the first surface;
a cap wafer having an inner surface and an outer surface, the inner surface being bonded to the first surface of the functional wafer;
a frame structure surrounding the device structures and being arranged between the functional wafer and the cap wafer;
connection posts connecting the device pads on the first surface to inner cap pads on the inner surface;
electrically conducting vias guided through the cap wafer connecting the inner cap pads on the inner surface and package pads on the outer surface of the cap wafer
a bridging line on the inner surface connecting two of the connection posts; and
a conductor line on the first surface, wherein an air gap exists between the bridging line and the conductor line such that the bridging line and the conductor line form a contactless line crossing.

2. The wafer level package of claim 1, wherein the functional wafer is a substrate wafer with a functional layer on the first surface, and wherein the cap wafer comprises the same material as the substrate wafer.

3. The wafer level package of claim 1, wherein the functional wafer is a silicon wafer with a piezoelectric layer applied on the first surface, and wherein the device structures are electrodes adapted for exciting acoustic waves in the piezoelectric layer.

4. The wafer level package of claim 1, wherein the electrically conducting vias are filled with tungsten, and wherein the inner cap pads on the inner surface or the package pads on the outer surface of the cap wafer comprise a structured tungsten layer.

5. The wafer level package of claim 2, wherein a thickness of the cap wafer is smaller than a thickness of the functional wafer.

6. The wafer level package of claim 3, wherein the piezoelectric layer is a thin-film piezoelectric layer.

* * * * *